United States Patent
Badger

Patent Number: 5,686,866
Date of Patent: Nov. 11, 1997

[54] PHASE LOCKED LOOP PROVIDING FAST TUNING FOR LARGE FREQUENCY CHANGES

[75] Inventor: David Mark Badger, Indianapolis, Ind.

[73] Assignee: Thomson Consumer Electronics, Inc., Indianapolis, Ind.

[21] Appl. No.: 504,849

[22] Filed: Jul. 20, 1995

[30] Foreign Application Priority Data

Jul. 28, 1994 [GB] United Kingdom ............... 9415185

[51] Int. Cl.⁶ .................................................. H03L 7/085
[52] U.S. Cl. .......................................... 331/17; 331/25
[58] Field of Search ........................................ 331/17, 25

[56] References Cited

U.S. PATENT DOCUMENTS

| | | | |
|---|---|---|---|
| 3,694,776 | 9/1972 | Linder | 333/17 |
| 4,377,728 | 3/1983 | Hilbert | 329/305 |
| 4,890,072 | 12/1989 | Espe et al. | 331/17 |
| 5,059,979 | 10/1991 | Micic et al. | 341/152 |
| 5,153,530 | 10/1992 | Takagi et al. | 331/17 |
| 5,220,294 | 6/1993 | Ichikawa | 331/17 |
| 5,386,437 | 1/1995 | Yasuda | 375/120 |

FOREIGN PATENT DOCUMENTS

| | | |
|---|---|---|
| 2662875 | 12/1991 | France . |
| 52-124846 | 10/1977 | Japan . |
| 5-129946 | 5/1993 | Japan . |

OTHER PUBLICATIONS

Digital Fast Acquisition Method for Phase-Lock Loops, By R.C. Den Dulk, GB Electronics Letters, Aug. 18, 1988, vol. 24, No. 17, pp.1079-1080.

*Primary Examiner*—Siegfried H. Grimm
*Attorney, Agent, or Firm*—Joseph S. Tripoli; Frederick A. Wein; Peter M. Emanuel

[57] ABSTRACT

A more rapid charging of an integrating capacitor of a PLL is provided when large frequency changes are desired. In one embodiment, the phase locked loop (PLL) circuit sinks or sources current to charge or discharge the integrating capacitor. A threshold voltage proportional to a current through the capacitor turns on an augmenting circuit which sinks or sources more current of the proper polarity to the integrating capacitor from an external source until a PLL lock is achieved. Once the lock is achieved, if a small correction current is required by the PLL, the small correction current is below a threshold required to actuate the augmenting circuit, and the PLL loop behaves in the usual manner as if the augmenting circuit were not present. In another embodiment, the integrating capacitor is reduced in value by switchably connecting a second capacitor in series with the integrating capacitor so that the total reduced capacitance of reduced value can be charged more quickly.

7 Claims, 5 Drawing Sheets

PHASE LOCKED LOOP PROVIDING FAST TUNING FOR LARGE FREQUENCY CHANGES

FIELD OF APPLICABILITY

The present invention concerns fast acting control systems which are usable, e.g., to tune electronic devices such as RF signal receivers.

Background

In a modern television receiver, two or more pictures at the same time, for example, in current 4×3 aspect ratio screens, small images, are inserted within a larger image. Newer wide screen television receivers (16×9 aspect ratio wide screen display format) sometimes have a "POP" feature (picture-outside-picture) which can display three or more auxiliary pictures in a vertical column in unused screen area along side the main picture when the 16×9 wide screen receiver is set for the main picture to be displayed with a 4×3 aspect ratio.

For providing such a feature, the receiver is provided with two tuners. The first tuner is used to provide the main picture and the second tuner is used to provide the POP pictures. These POP pictures are "snap shots" of 3 other sources, usually other channels, acquired by sequentially tuning the second tuner to one of the channels, loading video memory with one field from that channel, and then proceeding to the next channel. If the tuner takes 300 milliseconds (ms) to tune between POP sources, it may take more than a second for the second tuner to cycle through all of the three channels. This very slow refresh rate degrades the viewability of the POP channels so that the POP pictures are usually used only to monitor the available programming appearing on the POP channels. However, if the tuner used to sample the POP channels could tune fast enough, then all three POP pictures could be updated at almost a real time rate.

The present invention is also applicable where it is desirable to fast tune to a selected frequency which is at a frequency distant from the current frequency. Such a situation can occur in the case of direct satellite broadcasting where over 500 channels are available. Moreover, the invention is generally applicable to speed-up the operation of a control system including an integrator.

Prior Art

In a phased locked loop (PLL) for a control system such as a television tuner, a frequency representative signal is generated by a controllable oscillator and compared against a reference frequency in a phase detector (PD), with the output signal from the phase detector having a DC component which is indicative of the phase and frequency difference between the two signals. The output signal from the phase detector is coupled to an active or passive low pass filter for smoothing out small changes in the output signal. The low pass filtered signal can be used to adjust the controlled oscillator, usually in the form of a voltage controlled oscillator (VCO). In place of the low pass filter, modern PLL circuits use a current sourcing output stage which is coupled to an integrating capacitor in the feedback loop of an amplifier. In such an arrangement, if there is a large difference between the frequency of the received signal and the frequency of the selected signal, it can take hundreds of milliseconds before the large integrating capacitor reaches the desired DC voltage so that the PLL will lock. It is this long integration time which prevents the quick tuning of a tuner, e.g., for the POP pictures.

Prior art tuner control arrangements shown in FIGS. 1–3, have disadvantages for use for POP pictures. In the various figures, like members are designated with like numerals. Television tuners which use a phase locked loop can have lock times as long as 300 milliseconds (ms).

Referring to FIG. 1, transistor 14 is an off-chip relatively high power amplifier coupled to the output terminal of a lower power operational amplifier 16 disposed on an integrated circuit chip as part of PLL 10. The tuning signal from the phase detector is coupled to input terminal 17 of operational amplifier 16 and in turn to transistor 14. The output signal from the collector of transistor 14 is coupled to various varactor diodes in tuned circuits (not shown) of VCO 12, and is also fedback to terminal 17 through integrating capacitor 18 and a network 19 comprising a resistor 20 in parallel with a capacitor 22. Resistor 24 provides power supply voltage to the collector electrode of transistor 14. Thus, for the feedback loop, the forward gain is provided by amplifiers 14,16.

Capacitor 18 is the integrating capacitor as discussed above. Capacitor 22 provides high frequency roll-off for the feedback loop. In this arrangement, the long PLL lockup time is caused by the limited collector output voltage slew rate (dv/dt) of transistor 14 to charge (or discharge) capacitor 18. In this particular case, the slew rate limitation of transistor 14 is dependent upon the slew rate limitation of amplifier 16.

An arrangement similar to that discussed in an article by Bernard Glance, in the September 1985 issue of IEEE transactions on Microwave Theory and Techniques, MTT-33, Volume 9, entitled "New Phase-Locked Loop Circuit Providing Very Fast Acquisition Time", is shown in FIG. 2. Anti-parallel diodes 30,32 are connected across resistor 28 in the input circuit of amplifier 14,16. This arrangement is intended when a multiplying phase detector (PD) 34 is used in the PLL. Diodes 30,32 act to lower the effective value of resistor 28 when the DC voltage from the phase detector exceeds a diode conduction threshold voltage of about 0.6 volts.

However, Glance will not work with a digital phase detector. With a digital phase detector, the phase detector response is in the form of a pulse width modulated square wave having an average DC value which is the correction signal. Because these pulses all have the same amplitude, the pulses cause the diodes to turn "on" regardless of the amount of tuning error. This means that at least one of the diodes will always be active, even for very low phase errors (narrow-pulse widths) and the steady state characteristics of the system will be altered.

The circuit shown in FIG. 3 shows a PLL using a tri-state phase detector 34 such as employed in a Motorola 44802 integrated circuit. Such a circuit is relatively fast when tuning a span of only 1–2 channels. For example, it may only take 20 ms to tune from channel 10 to 12. However, when tuning across a band break, such as from channel 6 to channel 7 in the U.S., or the low end of the one band to the high end of another band, it may take more than 100 ms. This is because the phase detector has a maximum output which is usually limited to ½ Vcc. When large frequency changes are required, the detector saturates and there is a limit as to how fast integrating capacitor 18 can be charged in response to phase detector output signal Vd. More particularly, neglecting the voltage drop across resistor 20, the voltage charge rate dv/dt of capacitor 18 will be dependent upon Ic or Iin, and the values of capacitor 18 and resistor 28. Thus, if a large change in tuning voltage is required, there could be a slew rate limitation of the output signal of phase detector 34.

In such an arrangement, the values of capacitor 18 and resistor 28 are large, because the tuning voltage is used to control a VCO, the sensitivity of the VCO is high and the loop bandwidth (BW) must be low. For example, in some tuners Vd=1.3V, resistor 28=22k, and capacitor 18=0.22 microfarads, so that for a dv/dt=260 v/Sec. it would take about 100 ms to tune 25 volts.

SUMMARY OF THE INVENTION

According to aspects of the present invention, a more rapid charging of an integrating capacitor of a control system, such as PLL, is provided when large changes in the charge of the integrating capacitor are required, e.g., large frequency changes (large error) in the tuning of a tuner. An error correcting circuit includes means to sink or source current from an external source in order to charge or discharge the integrating capacitor at a higher charge/discharge rate than would otherwise be available. In this embodiment, a voltage is generated which is proportional to the charge/discharge current of the capacitor of the PLL. When this voltage exceeds a threshold voltage, an augmenting circuit is turned on which sinks or sources additional current of the proper polarity to the integrating capacitor from the external power source, until PLL lock or error correction is achieved. Once the error correcting circuit or PLL loop is locked, if a small correction current is required for small errors or tuning corrections, the magnitude of the correction current is below the threshold voltage required to actuate the augmenting circuit, and the control circuit or PLL behaves in the usual manner as if the augmenting circuit were not present.

BRIEF DESCRIPTION OF THE DRAWINGS

Reference may be had to the drawings wherein.

DETAILED DESCRIPTION OF THE PREFERRED EMBODIMENT

Figure 1:
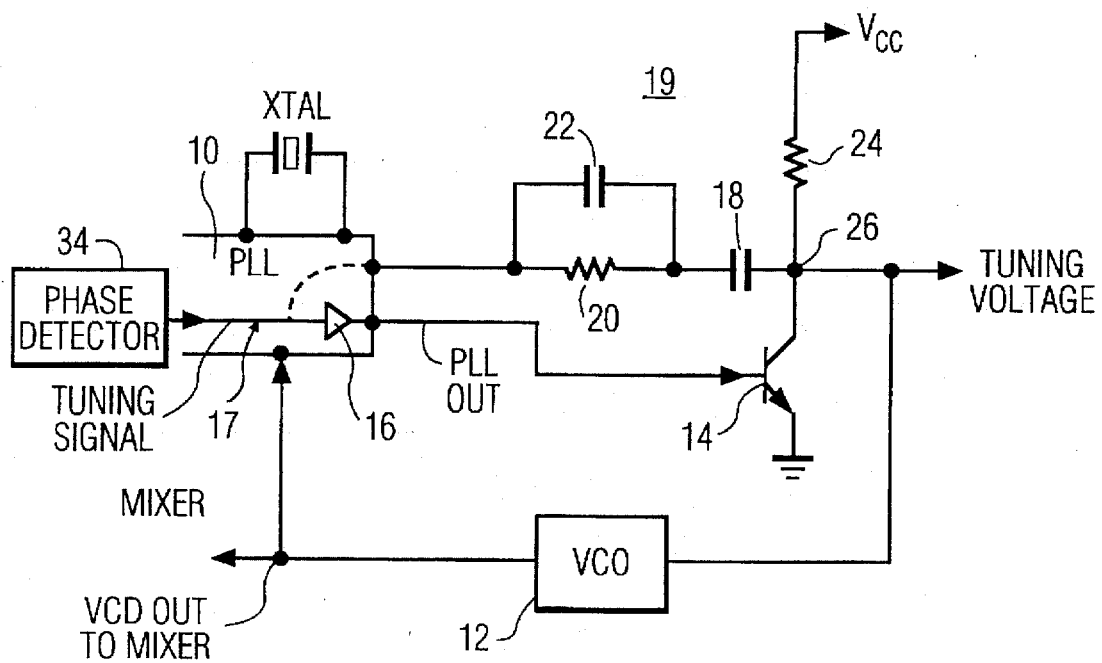
FIGS. 1-3 show portions of tuners according to the prior art, partially in block diagram form and partially in schematic form.
Figure 4:
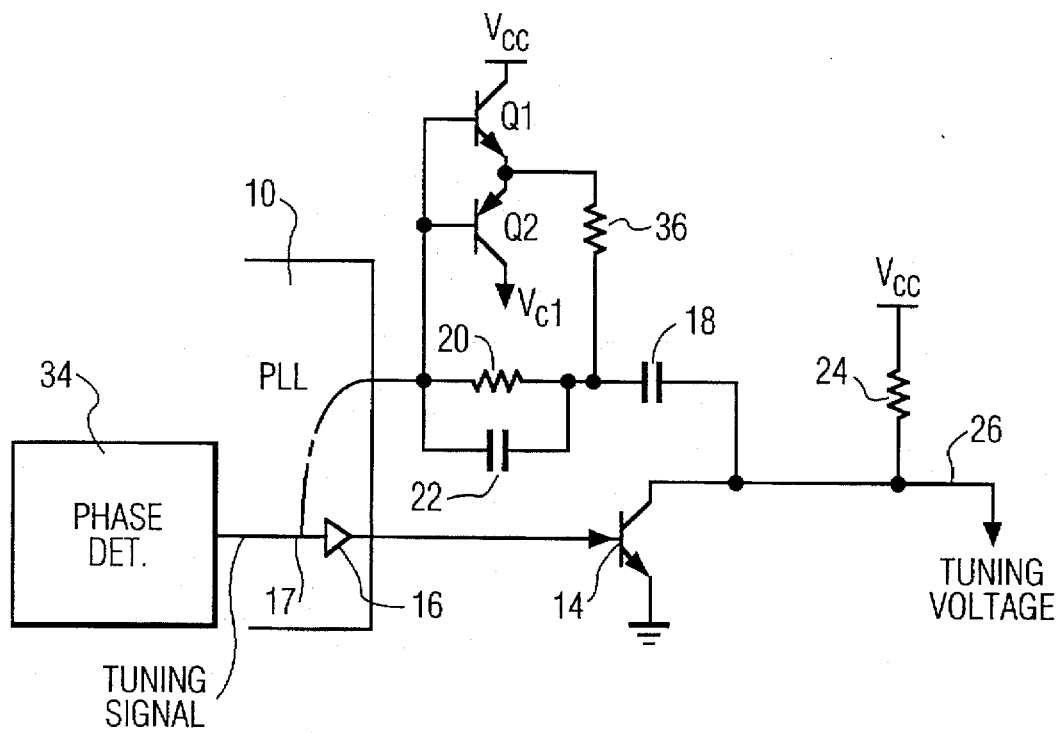
FIGS. 4 and 6 show various embodiments, partially in block diagram form and partially in schematic form.

Referring now to FIG. 4, according to aspects of the present invention, the tuning arrangement shown in FIG. 1 is made quicker by the faster charging of integrator capacitor 18 when a large frequency error exists, e.g., the selected channel is distant in frequency from the currently tuned channel. In order to change frequency, PLL 10 sinks or sources current to charge (or discharge) capacitor 18. As in FIG. 1, capacitor 18 and parallel network 19 are coupled as a feedback network for amplifier 14,16. However, as shown in FIG. 4, complementary transistors Q1 and Q2 have their collector electrodes respectively coupled to +Vcc and −Vcc with the base electrodes coupled to the PLL side of network 19. The emitter electrodes of transistors Q1,Q2 are coupled together with both emitters coupled through resistor 36 to the junction of network 19 and integrating capacitor 18.

The voltage developed across network 19 by the sinking/sourcing current from/to capacitor 18, due to the error correction action of PLL 10, produces a voltage across resistor 20, which makes one of complementary transistors Q1,Q2 conductive when that voltage exceeds the Vbe of the appropriate transistor for the corresponding polarity of current. The conductive transistor Q1,Q2 couples capacitor 18 to an appropriate power supply source, i.e., +Vcc or −Vcc, through resistor 36. This action provides additional sinking/sourcing current from the external power supply, of the correct polarity, to charge capacitor 18 in a shorter period of time.

The value of resistor 36 is chosen to limit the maximum sourcing/sinking current which can be provided to capacitor 18, with the resistance value of resistor 36 having an effect on the transient response of the system. For example, it is possible to provide a charging impulse current level which will produce overshoot or ringing in the circuit. Moreover, transient response can be further effected because the input circuit of the conducting transistor Q1,Q2, along with resistor 36, shunt feedback resistor 20.

Thus, if there is a slew rate limitation in the system, e.g., in PLL 10 or amplifier 14,16, which prevents fast charging/discharging of capacitor 18, this slew rate limitation can be circumvented, as shown. The augmentation of the capacitor charging/discharging current provided by the tuning signal from PLL 10 permits a quick change of the electrical state of capacitor 18 to a charge state which will correspond to the selected channel.

It should be noted that the additional sinking/sourcing current provided to capacitor 18 by transistors Q1,Q2 does not flow through resistor 20. Thus, when tuning is complete, i.e., capacitor 18 is charged/discharged according to the output voltage of PLL 10 and PLL 10 has obtained a lock, the voltage generated across resistor 20 by PLL 10 becomes insufficient to keep the appropriate transistor Q1,Q2 conductive, i.e., the voltage is less than the Vbe diode potential of the appropriate transistor, and transistors Q1,Q2 are rendered non-conductive. Thus, once lock is established, small correction currents required to compensate for temperature drift are not enough to turn "on" either of transistors Q1,Q2 and PLL 10 behaves as if transistors Q1,Q2 were not present.

In the arrangement shown in FIG. 4, the current augmenting arrangement of integrating capacitor 18 uses externally provided currents in order to charge/discharge the integrating capacitor at a faster rate to provide shorter response time. This is in contrast to the arrangements shown in FIGS. 1, 2 and 3, where the charging currents for the integrating capacitor are subject to slew rate limitations of phase detector 34 and amplifier 14,16. The best that the circuit of FIG. 2 can do is to momentarily reduce the resistance in series with integrating capacitor 18 by having the diodes conduct and bypass resistor 28. However, the charging/discharging currents still come from phase detector 34 or amplifier 14,16, and the magnitude of such charging/discharging current are much more limited compared to the augmenting charging/discharging current of the arrangements shown in FIGS. 4 and 5 which are derived directly from a power supply.

Figure 2:
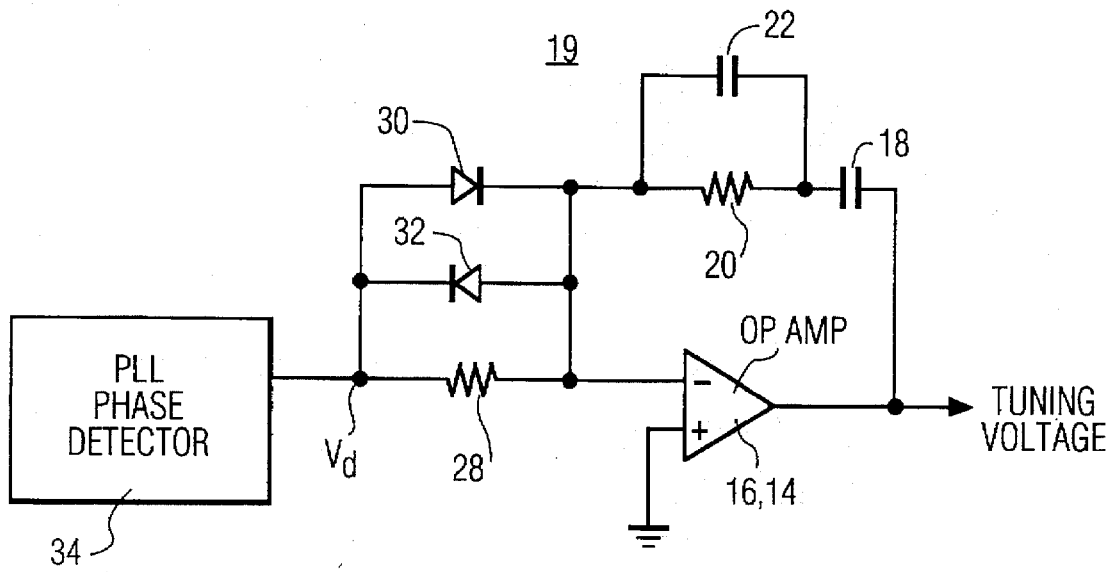
Figure 3:
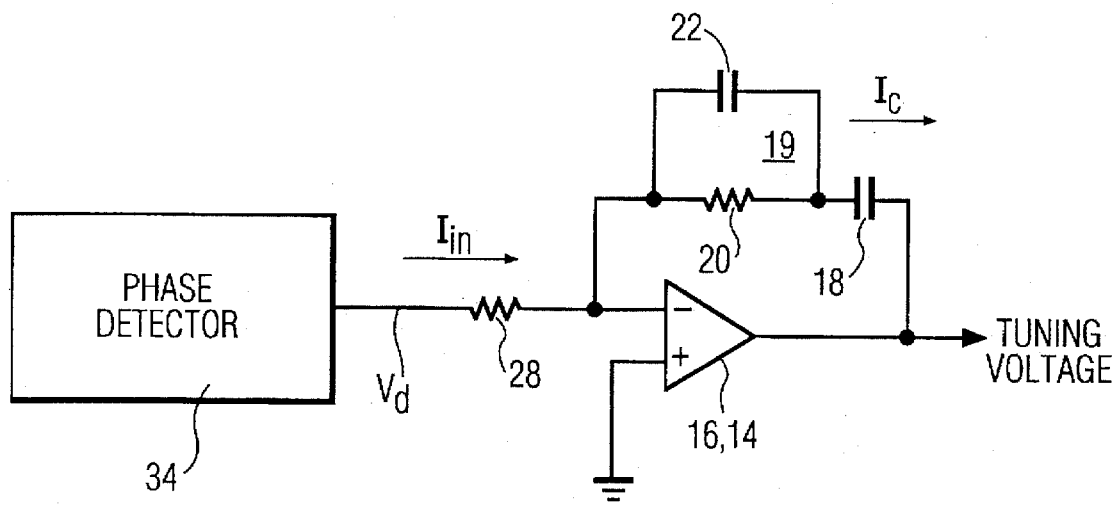

The circuit arrangement of FIG. 4 uses a current source output which does not require the resistor 28 of the prior art of FIGS. 2 and 3, and has a Bode pole formed by resistor 20 and capacitor 22. Capacitor 22 filters the phase detector pulses to a DC voltage across resistor 20 and thus, the circuit arrangement can be used with a digital phase detector.

Figure 5A:
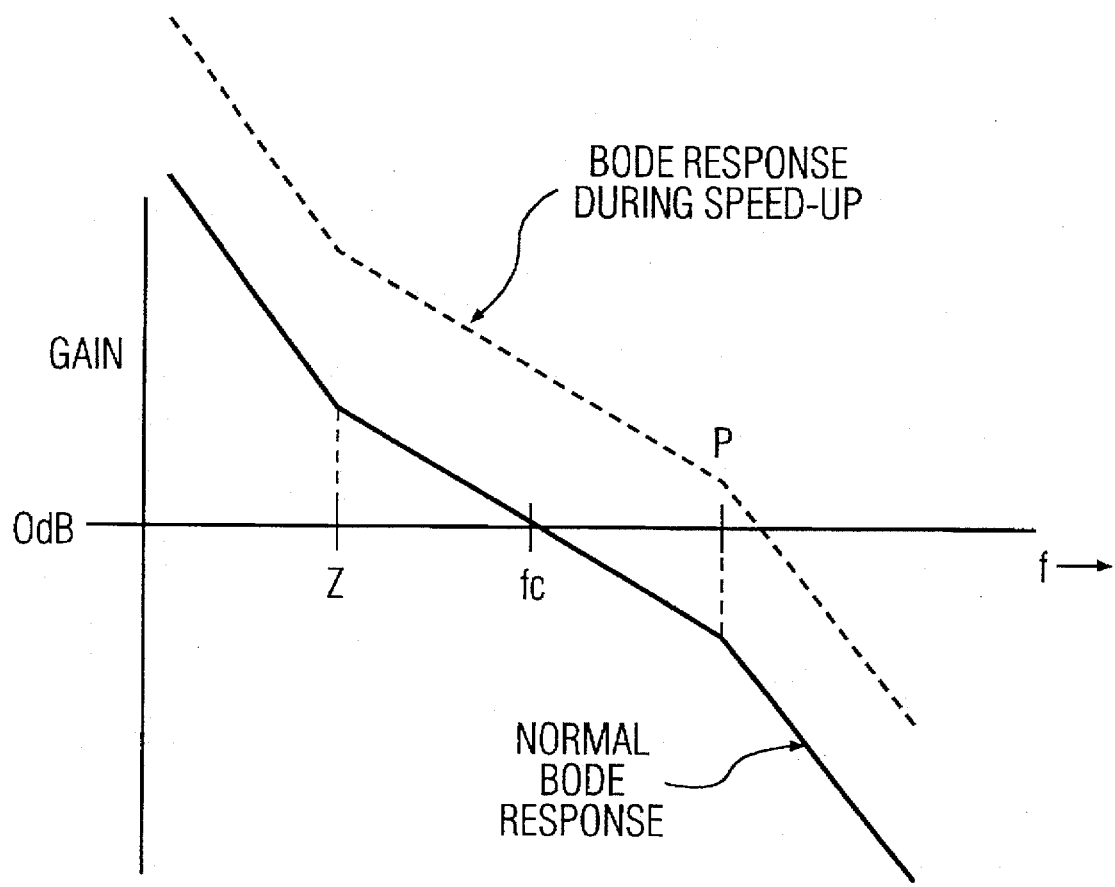
FIGS. 5a and 5b show Bode response characteristics of the embodiment of FIG. 4.

Normally the open loop gain of FIG. 4 will have a frequency response as shown in FIG. 5a. Since the magnitude response crosses the 0 dB ordinate at a 20 dB/decade slope and the zero (z) and pole (p) are away from this cross-over point, the phase margin (fc) for stability would be adequate. When the speed-up circuit is active, as shown by the dotted line of FIG. 5a, the gain increases and the abscissa cross-over point shifts up in frequency. This results in a decreased phase margin, with the third order-pole (p) provided by network 19 being close to the cross-over frequency.

Figure 5B:
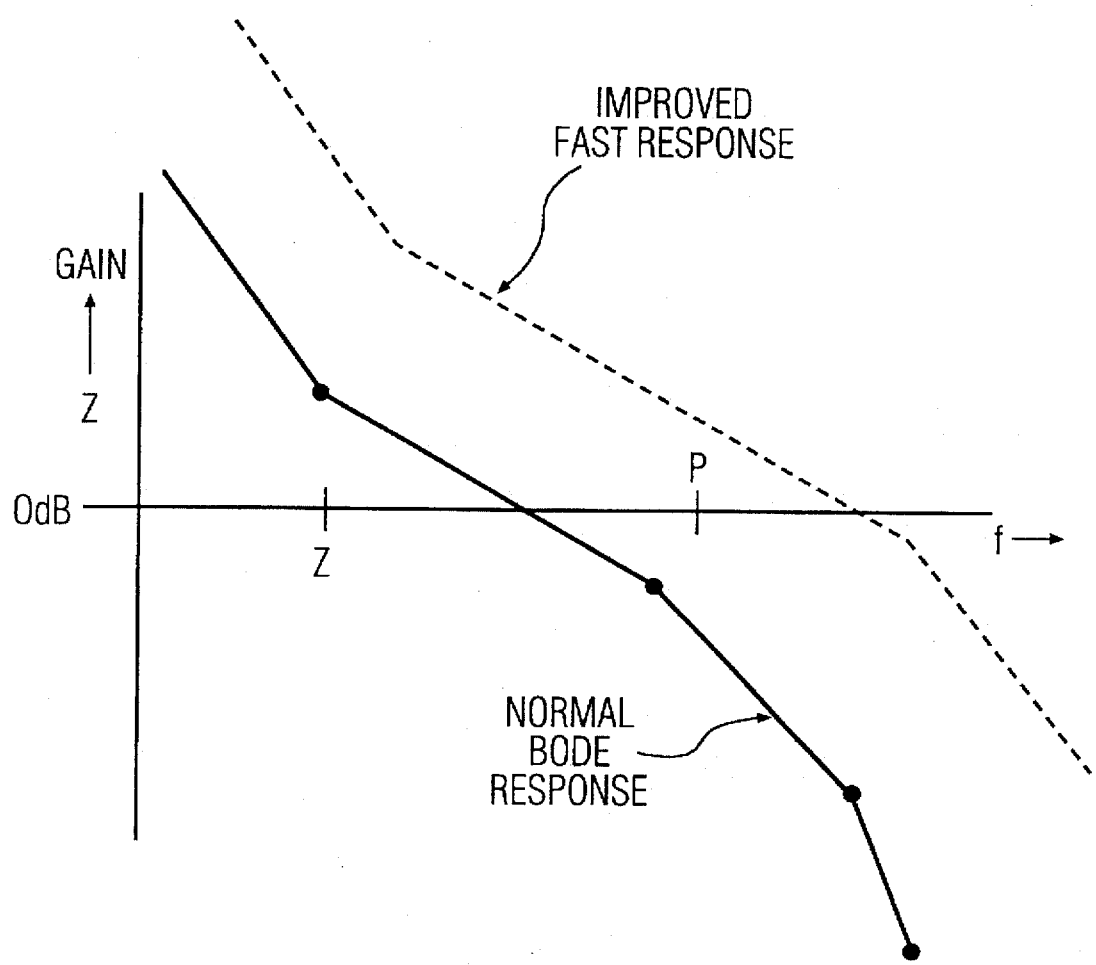

An improved response is shown in FIG. 5b wherein the gain is increased and the third order pole is further removed from the abscissa cross-over point, which helps to maintain phase margin. The movement of the pole is accomplished because transistors Q1,Q2, and resistor 36, coupled across resistor 20 and capacitor 22, act to shunt network 19, the presence of which is the reason for the existence of the pole.

The speed of the PLL of the present invention is very fast although it cannot be made arbitrarily small. The locking time of the PLL can be reduced to below 10 ms, which is a sufficiently short time for the three POP pictures to have an almost real life motion.

Figure 6:
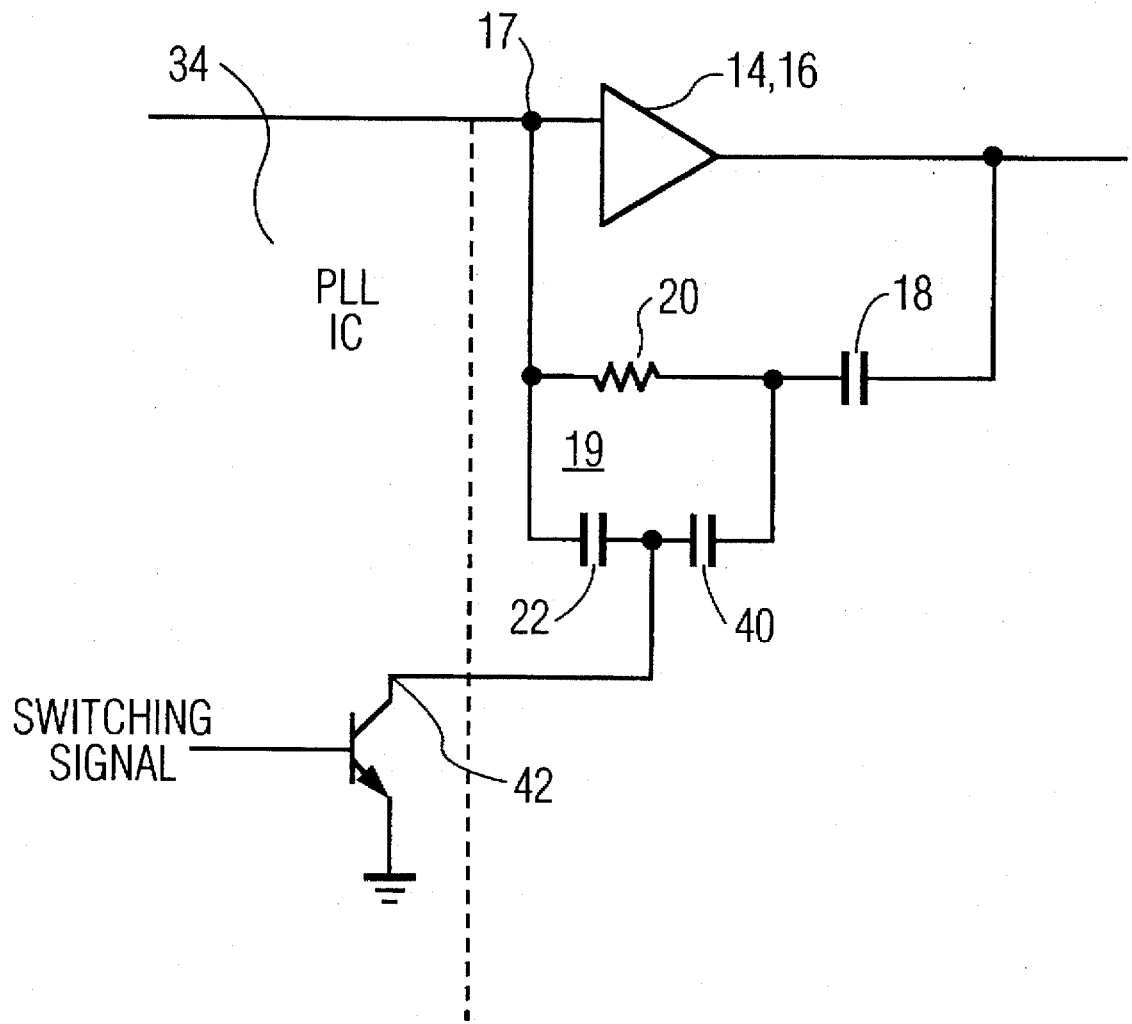

Referring now to FIG. 6, a second embodiment of the present invention is shown. Due to the large gain of amplifier 14,16, the input terminal 17 of amplifier 14,16 is a virtual ground node. One end of a capacitor 40 is coupled to the junction of network 19 and capacitor 18, and the other end is switchably coupled to ground by a switching transistor 42. When transistor 42 is inactive (non-conducting), the feedback loop behaves in a usual manner. However, when transistor 42 is rendered conductive by a switching signal applied to the base electrode, the end of network 19 coupled to capacitor 18 is coupled to ground through the collector-emitter circuit of transistor 42 and capacitor 40, with the other end of the network 19 being coupled to the virtual ground node of input terminal 17. If the value of capacitor 40 is much larger than the value of capacitor 22, network 19 is signal shunted and is out of the system. Thus, this arrangement of capacitor 40 switchably coupled across network 19 eliminates pole P3 of FIGS. 5a and 5b. The switching signal applied to the base of transistor 42 can be, e.g., a signal indicative that there is no PLL lock, or the negative of a signal indicative that there is PLL lock.

However, there is another aspect to the circuit of FIG. 6. When transistor 42 is active (conducting), capacitors 18 and 40 are connected in series to ground. Since the total capacitance of capacitor 18 in series with capacitor 40 is less than the capacitance of capacitor 18 by itself, the reduced total capacitance reduces the time required for the charging/discharging of the integrating capacitor by amplifier 14,16, without any augmenting of the charge/discharge current coupled to integrating capacitor 18.

Although the present invention is shown in the context of a PLL tuner for the selection of tuning frequencies, the present invention is usable in control systems generally, in order to speedup response times.

I claim:

1. A tuning system for a television apparatus, comprising:
a phase detection means of a PLL for providing a tuning signal for the tuning of the apparatus in response to a signal selection;
means for tuning a receiver comprising an integrating means;
means for coupling a version of the tuning signal to the integrating means for integrating the version of the tuning signal over a first response time, the integrating means comprising an integrating capacitor which is one of charged or discharged by current responsive to the tuning signal, and
means for augmenting the one of charging and discharging of the integrating capacitor responsive to the tuning signal for charging and discharging the integrating capacitor over a second response time which is faster than the first response time, said augmenting means comprising coupling an additional current from a power supply source to the integrating means in response to a parameter of the tuning signal,
the means for augmenting includes means responsive to the amplitude of the current of one of charging and discharging the integrating capacitor.

2. A tuning system for a television apparatus, comprising:
a phase detection means of a PLL for providing a tuning signal for the tuning of the apparatus in response to a signal selection;
means for tuning a receiver comprising an integrating means;
means for coupling a version of the tuning signal to the integrating means for integrating the version of the tuning signal over a first response time, the integrating means comprising an integrating capacitor which is one of charged or discharged by current responsive to the tuning signal, and
means for augmenting the one of charging and discharging of the integrating capacitor responsive to the tuning signal for charging and discharging the integrating capacitor over a second response time which is faster than the first response time, said augmenting means comprising coupling an additional current from a power supply source to the integrating means in response to a parameter of the tuning signal.
the means for augmenting includes means for coupling one of a sourcing current and a sinking current to the integrating capacitor to provide additional current for one of charging and discharging of the capacitor when the tuning signal provided by the phase detector exceeds a threshold value.

3. A tuning system for a television apparatus, comprising:
a phase detection means of a PLL for providing a tuning signal for the tuning of the apparatus in response to a signal selection;
means for tuning a receiver comprising an integrating means;
means for coupling a version of the tuning signal to the integrating means for integrating the version of the tuning signal over a first response time, the integrating means comprising an integrating capacitor which is one of charged or discharged by current responsive to the tuning signal, and
means for augmenting the one of charging and discharging of the integrating capacitor responsive to the tuning signal for charging and discharging the integrating capacitor over a second response time which is faster than the first response time, said augmenting means comprising coupling an additional current from a power supply source to the integrating means in response to a parameter of the tuning signal,
the means for augmenting including means for coupling one of a sourcing current and a sinking current to the integrating capacitor to provide additional current for one of charging and discharging of the capacitor when the tuning signal provided by the phase detector exceeds a threshold value,
the one of sourcing current and sinking current is measured by sensing a voltage drop across a resistor coupled in series with the integrating capacitor.

4. The tuning system of claim 3 wherein the threshold value is determined by the threshold of conduction of a base-emitter junction of a transistor coupled across the resistor.

5. The tuning system of claim 4 wherein the voltage drop across the resistor is less than the threshold value for small tuning increments of the tuning signal.

6. The tuning system of claim 2 wherein the one of coupling of sourcing current and sinking current to the integrating capacitor is provided by a pair of complementary transistors coupled to respective polarities of the power supply source.

7. A tuning system for a television apparatus, comprising:

a phase detection means of a PLL for providing a tuning signal for the tuning of the apparatus in response to a signal selection;

means for tuning a receiver comprising an integrating means;

means for coupling a version of the tuning signal to the integrating means for integrating the version of the tuning signal over a first response time, the integrating means comprising an integrating capacitor coupled in the feedback circuit of an amplifier, the integrating capacitor being one of charged or discharged by current responsive to the tuning signal, and means for augmenting the one of charging and discharging of the integrating capacitor responsive to the tuning signal for charging and discharging the integrating capacitor over a second response time which is faster than the first response time, said augmenting means comprising a pair of complementary transistors for coupling an additional current from an external power supply source to the integrating means in response to the amplitude of a voltage drop across a resistor coupled in series with the integrating capacitor when the voltage drop across the resistor caused by a current responsive to the tuning signal exceeds a threshold value.

* * * * *